United States Patent
Roesner et al.

[11] Patent Number: 5,817,552
[45] Date of Patent: Oct. 6, 1998

[54] PROCESS OF MAKING A DRAM CELL ARRANGEMENT

[75] Inventors: Wolfgang Roesner, Munich; Lothar Risch, Neubiberg; Franz Hofman, Munich; Wolfgang Krautschneider, Hohenthann, all of Germany

[73] Assignee: Siemens Aktiengesellschaft, Munich, Germany

[21] Appl. No.: 635,526

[22] Filed: Apr. 22, 1996

[30] Foreign Application Priority Data

May 24, 1995 [DE] Germany ............ 195 19 160.9

[51] Int. Cl.⁶ .................................. H01L 21/8242
[52] U.S. Cl. ............................. 438/241; 438/270
[58] Field of Search .................... 438/238, 239, 438/240, 241, 243, 244, 245, 246, 247, 248, 381, 386, 387, 388, 399, 391, 270

[56] References Cited

U.S. PATENT DOCUMENTS 5,307,310  4/1994  Narita .
5,362,665  11/1994  Lu ................................ 437/52

FOREIGN PATENT DOCUMENTS 0 453 998 A1  10/1991  European Pat. Off. .
0 516 031 A1  12/1992  European Pat. Off. .

OTHER PUBLICATIONS

Patent Abstracts of Japan, vol. 13, No. 594 (E–867) [3942], 27 Dec. 1989, 7 JP–A–01 248557 (Toshiba Corp.), 04 Oct. 1989.
Patent Abstracts of Japan. vol. 14. No. 479, (E–992) 18 Oct. 1990, & JP–A–02 198170 (Hitach Ltd.), 06 Aug. 1990.
Patent Abstracts of Japan, vol. 9, No. 140 (E–321) 14 Jun. 1985, & JP–A–60 021558 (Mitsubishi Denki K.K.), 02 Feb. 1985.
1993 Symposium on VLSI Technology, Digest of Technical Papers, vol. 3A, No. 2, May 1993, A Straight–Line–Trench Isolation and Trench–Gate Transitor (SLIT) Cell for Giga––bit DRAMs, M. Sakao et al, pp. 19–20.

*Primary Examiner*—Charles L. Bowers, Jr.
*Assistant Examiner*—Lynne A. Gurley
*Attorney, Agent, or Firm*—Hill & Simpson

[57] ABSTRACT

For each storage cell, the DRAM cell arrangement has a vertical MOS transistor, the first source/drain region of which is connected to a memory node of a storage capacitor, the channel region of which is annularly enclosed by a gate electrode and the second source/drain region of which is connected to a buried bit line. The DRAM cell arrangement can be produced with a storage-cell area of $4F^2$ by using only two masks, F being the minimum producible structure size in the respective technology.

7 Claims, 3 Drawing Sheets

PROCESS OF MAKING A DRAM CELL ARRANGEMENT

BACKGROUND OF THE INVENTION

In DRAM cell arrangements, that is, storage cell arrangements with dynamic random access, so-called single-transistor storage cells are almost exclusively used. A single-transistor storage cell has a read-out transistor and a storage capacitor. The information is stored in the storage capacitor in the form of an electric charge which represents a zero logic value or a one logic value. By driving the read-out transistor via a word line, this information can be read out via a bit line.

Since the storage density increases from memory generation to memory generation, the required area of the single-transistor storage cell must be reduced from generation to generation. Since limits on the reduction in the structure sizes are set by the minimum structure size producible in the respective technology, this is also associated with an alteration of the single-transistor storage cell. Thus, until the 1 MBit generation, both the read-out transistor and the storage capacitor were produced as planar components. From the 4 MBit memory generation onwards, it was necessary to make a further area reduction by using a three-dimensional arrangement of the read-out transistor and storage capacitor. One possibility consists in producing the storage capacitor in a trench (see, for example, K. Yamada det al, A deep trenched capacitor technology for 4 MBit DRAMs, Proc. Intern. Electronic Devices and Materials IEDM 85, page 702).

It has furthermore been proposed (see, for example, Y. Kawamoto et al, A 1.28 $\mu m^2$ Bit-Line Shielded Memory Cell Technology for 64 MBit DRAMs, Techn. Digest of VLSI Symposium 1990, page 13) to make the storage capacitor in the form of a stacked capacitor. In this case a polysilicon structure, for example a crown structure or a cylinder, which makes contact with the substrate is formed over the word lines. This polysilicon structure forms the memory node. It is provided with a capacitor dielectric and a capacitor plate. This design has the advantage that it is highly compatible with a logic process.

The area for a storage cell of a DRAM in the 1 GBit generation should be only 0.2 $\mu m^2$. The storage capacitor must in this case have a capacitance of 20 to 30 fF. With a cell area such as is available in the 1 GBit generation, such a capacitance can be achieved in a stacked capacitor only with a relatively complicated structure of the polysilicon structure. These complicated structures are, in addition, ever more difficult to produce because of their topology.

It has furthermore been proposed to increase the capacitance achievable per unit surface area by using a dielectric having a high dielectric constant. Paraelectrics and ferro-electrics are, in particular, suitable as a dielectric having high dielectric constant (see, for example, International Application WO 93/12542).

SUMMARY OF THE INVENTION

It is an object of the present invention to provide a DRAM cell arrangement which has single-transistor storage cells as storage cells and which can be produced in the packing density required for the 1 GBit generation. A further object is to provide a production process for such a DRAM cell arrangement.

In the DRAM cell arrangement according to the present invention, single-transistor storage cells are provided, in which the read-out transistor is designed as a vertical MOS transistor. This being the case, a first source/drain region of the vertical MOS transistor adjoins a main surface of a semiconductor substrate in which the DRAM cell arrangement is produced. The second source/drain region adjoins a buried bit line.

The storage capacitor is arranged above the main surface. It has a memory node which is electrically connected to the first source/drain region. The memory node may be designed both in planar form and as a more or less complicated polysilicon structure, as is known from stacked capacitors.

According to one embodiment a capacitor dielectric is arranged on the main surface at the surface of the first source/drain region adjoining this main surface, and a capacitor plate is arranged above this capacitor dielectric. The first source/drain region adjoining the main surface is in this embodiment also used as the memory node for the storage capacitor formed by the capacitor plate, the capacitor dielectric and the source/drain region. In order to achieve a sufficient capacitance with a small memory node area, it is in this case advantageous to use as the capacitor dielectric a material having a relative dielectric constant in the range of between 100 and 1000.

A channel region which is annularly surrounded by a gate oxide and a gate electrode is arranged in the semiconductor substrate between the first source/drain region and the second source/drain region. The gate electrodes of neighboring vertical MOS transistors along a word line adjoin one another.

The DRAM cell arrangement is preferably produced in a semiconductor substrate which comprises monocrystalline silicon at least in the region for the DRAM cell arrangement. This semiconductor substrate can be both a continuous wafer of monocrystalline silicon and a SOI substrate which has, on a silicon wafer, an insulating wafer and a thin monocrystalline silicon layer on the latter.

When the first source/drain region is used as the memory node, the DRAM cell arrangement according to the invention can be produced with a planar surface or with a surface having a flat topology, so that a ferroelectric layer or a paraelectric layer can be used as the capacitor dielectric. Ferroelectric and paraelectric layers have high relative dielectric constants $\in_r$ in the range of 500 to 1000. If these layers are deposited by sputtering, they can only be used on planar surfaces or surfaces with a flat topology. Even with CVD or sol gel processes with better edge coverage complicated 3D structures cannot be produced because of the thickness required for the layers. Barium strontium titanate, strontium titanate or lead zirconate titanate is preferably used as the capacitor dielectric. The materials disclosed in International Application WO 93/12542 are also suitable as the capacitor dielectric. With these dielectrics having high relative dielectric constant, the required capacitance of 20 to 30 fF can be achieved even with an area of approximately 0.1 to 0.4 $\mu m^2$.

It is within the scope of the invention for each word line to be formed by the mutually adjoining gate electrodes.

The DRAM cell arrangement according to the present invention is preferably produced in a self-aligning process. In this case, regions extending over the region for the DRAM cell arrangement and having corresponding dopings for the source/drain regions and the channel region arranged inbetween are produced in the semiconductor substrate. First trenches which cut through the regions for the source/drain regions, the channel region and the bit lines are then produced. During etching of the first trenches, the bit lines are thereby defined. After the first trenches are filled with an insulation structure, second trenches extending transversely thereto, which cut through the regions for the source/drain regions and the channel regions, but do not cut through the bit lines, are etched. The second trenches are provided with a second insulation structure. The first insulation structure and the second insulation structure are then etched selectively with respect to the semiconductor material until the surface of the doped regions for the channel regions and the first source/drain regions are exposed at the sides of the first trenches and of the second trenches. A gate oxide is formed. In order to form the gate electrodes, a doped polysilicon layer with essentially conformal edge coverage is then produced.

The first trenches are produced with a smaller width than the second trenches. The thickness of the polysilicon layer is dimensioned such that the polysilicon layer fills the first trenches, but does not fill the second trenches. By etching back the polysilicon layer anisotropically, the surface of the second insulation structure is partly exposed in the second trenches. Doped polysilicon spacers are thereby left at the sides of the second trenches. Although the polysilicon remaining in the first trenches is also attacked during this anisotropic etching-back, the surface of the first insulation structures in the first trenches nevertheless remain covered with doped polysilicon. In this way the gate electrodes are produced as annular doped-polysilicon structures, the structure part respectively arranged in the first trenches belonging to two neighboring gate electrodes and connecting the latter to each other in accordance with the production process.

The gate electrodes are finally covered with a third insulation structure. The third insulation structure essentially completely fills the first trenches and the second trenches above the gate electrodes. In the second trenches, the third insulation structure insulates gate electrodes arranged at opposite sides. The capacitor dielectric and the capacitor plate are then applied. The third insulation structure is preferably also produced by depositing a layer with essentially conformal edge coverage and etching the layer back.

For self-aligning production it is essential for the widths of the first trenches and of the second trenches to differ, so that the polysilicon layer fills the first trenches but does not fill the second trenches. This makes it possible to structure the gate electrodes, which simultaneously form the word lines, without photolithographic steps. In this process, only two photolithographic steps are required. The etching of the first trenches and the etching of the second trenches are each carried out using a trench mask. These trench masks are, however, entirely uncritical as regards their alignment.

It is particularly advantageous to use a first trench mask produced as follows for etching the first trenches. A first $SiO_2$ layer is deposited and is structured using a photolithographic process. A second $SiO_2$ layer with essentially conformal edge coverage is deposited thereon and anisotropically etched, so that $SiO_2$ spacers by which the width of the first trenches is defined are produced at the sides of the structured first $SiO_2$ layer. In this way it is possible to produce the first trenches with a width which is smaller than that corresponding to the minimum producible structure size F in the respective technology. In this way the width of the second trenches can be equal to a minimum structure size F, for example 0.25 $\mu$m, in the respective technology, and the width of the first trenches can be smaller by twice the spacer width, since the structures produced in the first $SiO_2$ layer are also limited by the minimum structure width F. It is thereby possible to produce the DRAM cell arrangement with a space requirement of $4F^2$ per storage cell.

It is within the scope of the present invention for the regions for the source/drain regions and the channel region and the bit lines to be epitaxially grown as full-surface layers. In this case, when a substrate comprising monocrystalline silicon in the region of the DRAM cell arrangement is used, it is possible to produce a conductive layer of epitaxially grown $CoSi_2$ under the second source/drain regions in order to improve the conductivity of the bit lines. This conductive layer is also cut through during etching of the first trenches and is a component of the bit lines.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGURES of which like reference numerals identify like elements, and in which:

DESCRIPTION OF THE PREFERRED EMBODIMENTS

Figure 1:
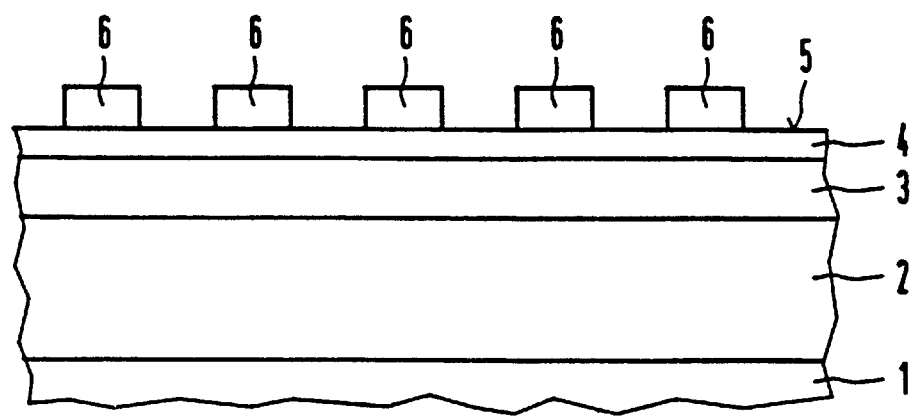
FIG. 1 depicts a semiconductor substrate having a first structured $SiO_2$ layer.

The starting material is a substrate having a region 1 of, for example, p-doped monocrystalline silicon with a dopant concentration of, for example, $10^{17}$ cm$^{-3}$, which is provided with a first layer 2 of n$^+$-doped silicon with a dopant concentration of, for example, $10^{20}$ cm$^{-3}$, with a second layer 3 of p-doped silicon with a dopant concentration of, for example, $3\times10^{17}$cm$^{-3}$ and a third layer 4 of n$^+$-doped silicon with a dopant concentration of, for example, $10^{21}$cm$^{-3}$ (see FIG. 1). The first layer 2, the second layer 3 and the third layer 4 are preferably produced by epitaxial growth. The third layer 4 forms a main surface 5 of the substrate. The first layer 3 has a thickness of, for example, 200 nm and the third layer 4 has a thickness of, for example, 100 nm.

A first $SiO_2$ layer 6 is applied onto the main surface 5 and is structured. The first $SiO_2$ layer 6 is, for example, deposited in a TEOS process at a thickness of 150 nm. A photoresist mask (not represented) is used for structuring the first $SiO_2$ layer 6. The structuring is carried out in a dry etching process. The main surface 5 is thereby exposed.

Figure 2:
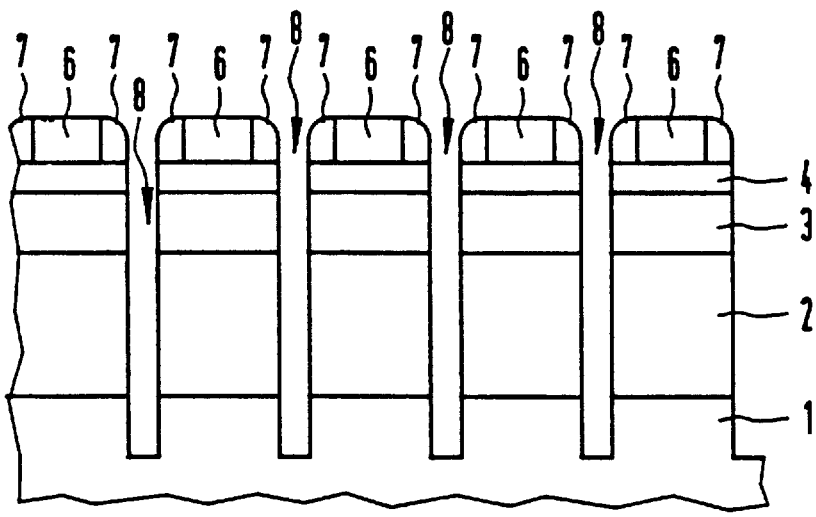
FIG. 2 depicts the semiconductor substrate after formation of a first trench mask and etching of first trenches.

After the photoresist mask has been removed, $SiO_2$ spacers 7 are formed at vertical sides of the structured first $SiO_2$ layer 6. For this purpose a second $SiO_2$ layer is deposited in a TEOS process at a layer thickness of, for example, 80 nm. The spacers 7 are formed from the second $SiO_2$ layer by anisotropic dry etching selectively with respect to silicon (see FIG. 2).

By using the structured first $SiO_2$ layer 6 and the $SiO_2$ spacers 7, first trenches 8 are etched in an anisotropic dry etching process. HBr, $NF_3$, He, $O_2$ are, for example, suitable as the etching process. The first trenches 8 are produced with a depth of, for example, 1000 nm. The first trenches 8 thereby extend into the p-doped region 1 of the semiconductor substrate. The first trenches 8 cut through the first layer 2, the second layer 3 and the third layer 4. Parallel to the main surface 5, the first trenches 8 have a strip-shaped cross-section. The first trenches 8 extend essentially parallel over the entire cell field. The first trenches 8 have a width of, for example, 90 nm and a length of 64 µm. The distance between the centers of neighboring first trenches 8 is, for example, 500 nm, which corresponds to twice the minimum structure size F =250 nm in the technology used.

By wet chemical etching, for example with $NH_4F$ (30%) /HF (6%), the structured first $SiO_2$ layer 6 and the $SiO_2$ spacers 7 are then removed.

By depositing another $SiO_2$ layer in a TEOS process with a layer thickness of 100 nm, the first trenches 8 are filled with a first insulation structure 9. In order to form the first insulation structure 9, the $SiO_2$ layer is etched back and planarized until the main surface 5 is exposed outside the trenches 8. Etching-back is carried out in a dry etching process, for example, with $CHF_3$, $O_2$.

Figure 3:
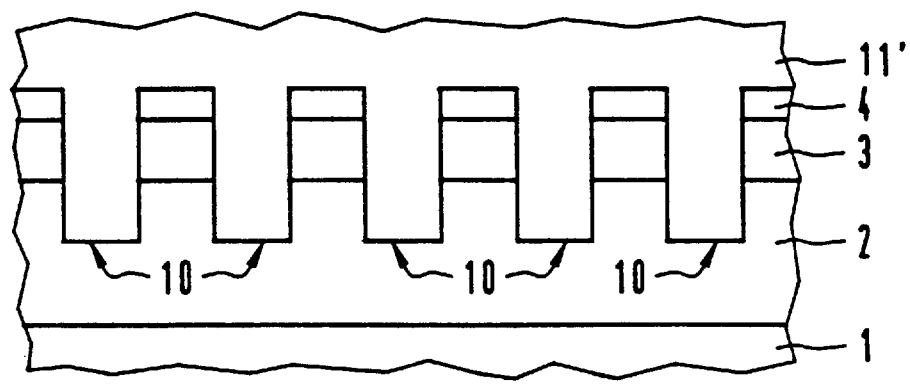
FIG. 3 depicts a section, perpendicular to the section shown in FIG. 2, through the semiconductor substrate after the etching of second trenches and filling of the second trenches.

Another etching mask is then produced using a photolithographic process and is used as the etching mask for etching second trenches 10 (see FIG. 3). In order to form the second trenches 10 it is necessary to use an etching process which attacks silicon selectively with respect to $SiO_2$. HBr, $Cl_2$, He, $O_2$ are, in particular, suitable for this. The second trenches 10 extend, for example, perpendicularly to the first trenches 8 (FIG. 3 depicts a section, perpendicular to FIG. 2, through the arrangement). In order to avoid subsequent short-circuits, it is essential for the silicon at side walls of the first insulation structure 9 to be removed without leaving a residue during etching of the second trenches 10. In order to ensure this, a wet etching step with, for example, choline may also be added after the anisotropic dry etching. The second trenches 10 are etched to a depth of, for example, 500 nm. The second trenches 10 extend into the first layer 2, but without cutting through it. In the finished DRAM cell arrangement, the continuous part of the first layer 2 acts respectively as a bit line. Parallel to the main surface 5, the second trenches 10 have a strip-shaped cross-section. They extend essentially parallel and have a width of 250 nm and a length of 128 µm. The separation of the centers of neighboring second trenches 10 is, for example, 500 nm, that is, 2F.

After the trench mask has been removed, the second trenches 10 are filled by depositing a $SiO_2$ layer 11' in a TEOS process to a layer thickness of, for example, 300 nm.

By anisotropic dry etching, for example with $CHF_3$, $O_2$, the $SiO_2$ layer 11' is etched back. Second insulation structures 11 are thereby formed in the second trenches 10. The anisotropic dry etching process attacks $SiO_2$ selectively with respect to silicon. The etching process is continued until the surface of the second insulation structures 11 is 400 nm below the main surface 5. This dry etching process also attacks the first insulation structures 9, the surface of which after the dry etching process is at the same height as that of the second insulation structure 11. During the etching-back, the surfaces of the third layer 4 and of the second layer 3 adjoining the sides of the respective trench are fully exposed in the first trenches 8 and in the second trenches 10. If required, this can be ensured by an additional wet etching step, for example with HF (1%).

Figure 4:
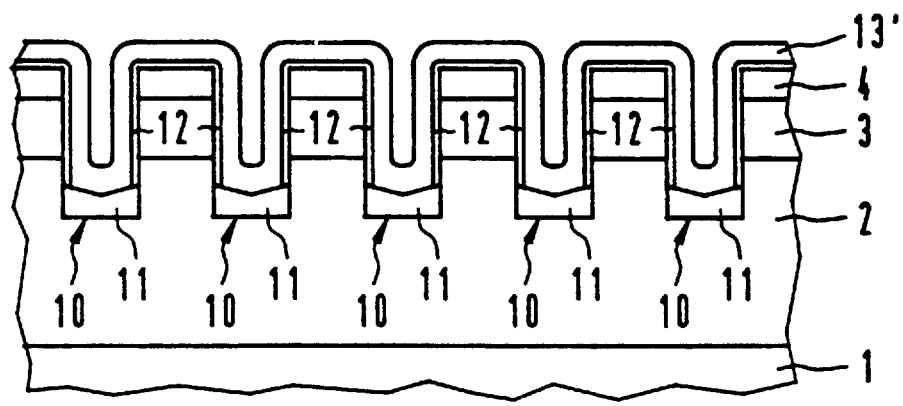
FIG. 4 depicts the section through the semiconductor substrate shown in FIG. 3 after formation of agate oxide and deposition of a doped polysilicon layer.

In order to form a gate oxide 12 at the surface of the second layer 3, thermal oxidation at, for example, 800° C. is then carried out. The gate oxide 12 is formed to a thickness of, for example, 5 nm. During the thermal oxidation, a 5 nm thick $SiO_2$ layer is formed at all exposed silicon surfaces. An in-situ doped polysilicon layer which is, for example, n-doped by phosphorus with a dopant concentration of $10^{21}$ $cm^{-3}$, is deposited to a thickness of 80 nm (see FIG. 4). The doped polysilicon layer 13' is deposited with conformal edge coverage. As a result, the second trenches 10 are not filled. In contrast, the first trenches 8, which have a smaller width than the second trenches 10, are in this case filled.

Figure 5:
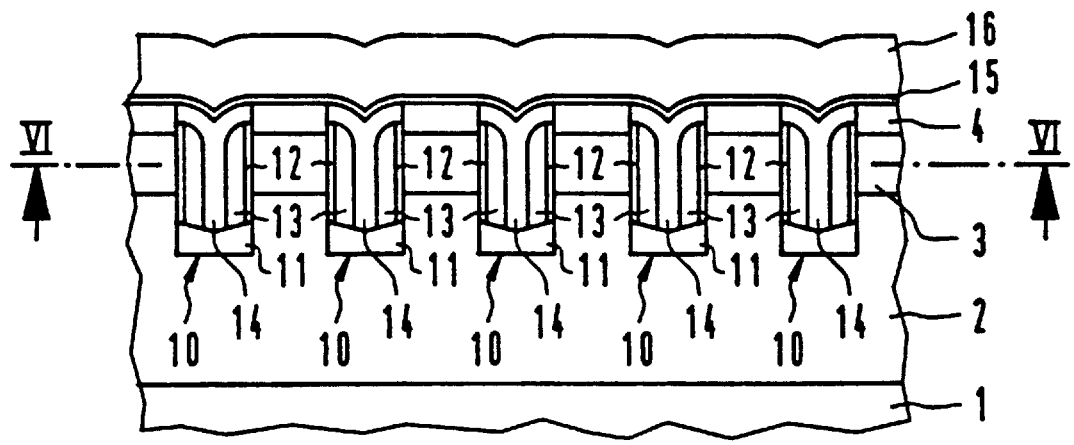
FIG. 5 depicts the section through the semiconductor substrate shown in FIG. 4 after formation of the gate electrode and fabrication of the storage capacitors.

In order to form gate electrodes 13, the doped polysilicon layer 13' is etched back in a anisotropic dry etching process. The surface of the second insulation structure 11 in the second trenches 10 is thereby exposed. That part of the gate electrodes 13 which is arranged in the second trenches 10 forms a spacer along the sides of the second trenches 10. The anisotropic etching is carried out, for example, with HBr, $Cl_2$, He, $O_2$, a polysilicon thickness of 150 nm being etched. This means that the etching is carried out to considerable excess, so that the sides of the third layer 4, which are covered with gate oxide, are exposed in the region of the second trenches 10 (see FIG. 5). The thin $SiO_2$ layer formed during the gate oxidation at the surface of the third layer 4 in the region of the main surface 5 acts as an etching barrier during the anisotropic etching.

Figure 6:
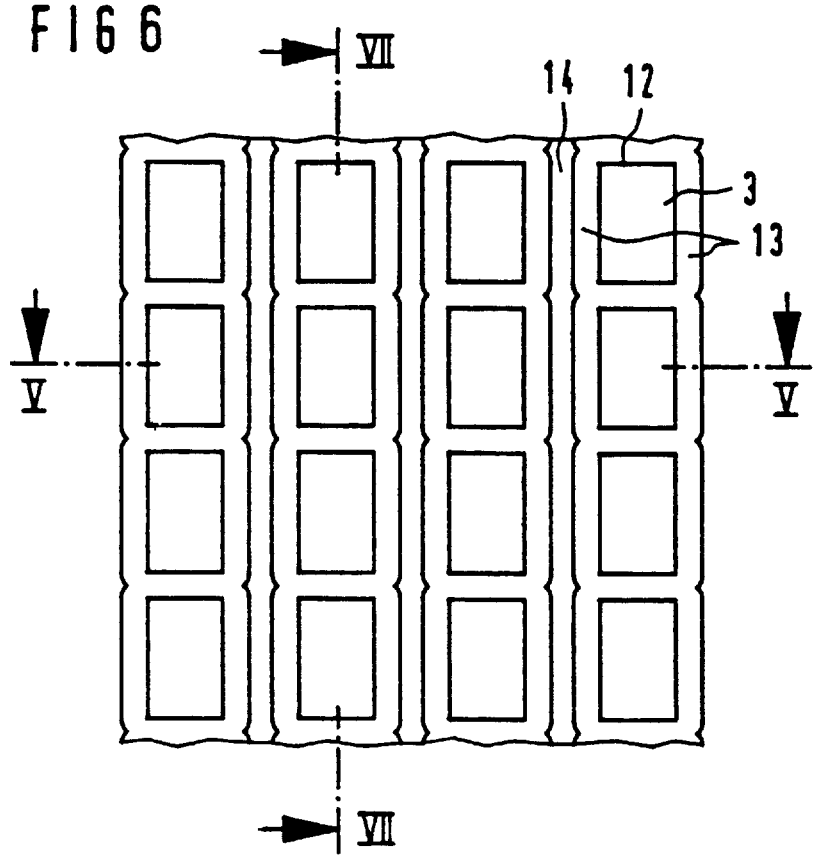
FIG. 6 depicts the section through the semiconductor substrate referenced VI—VI in FIG. 5.
Figure 7:
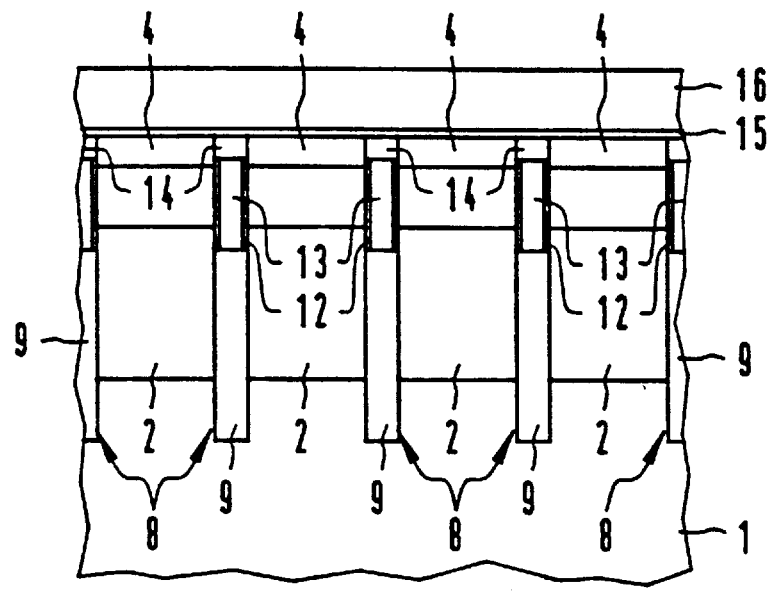
FIG. 7 depicts the section through the semiconductor substrate referenced VII—VII in FIG. 6.

During the anisotropic etching to form the gate electrodes 13, the doped polysilicon layer 13' in the first trenches 8 which are filled by the doped polysilicon layer 13' is etched back to below the height of the main surface 5 (see FIG. 7). Each gate electrode 13 annularly surrounds a part of the second layer 3 which is bounded by two neighboring first trenches and two neighboring second trenches (see FIG. 6). Because of the small width of the first trenches 8, neighboring gate electrodes 13 are connected to each other via the part arranged in the respective first trench 8.

Another $SiO_2$ layer is deposited in a TEOS process to a layer thickness of, for example, 150 nm and is etched back anisotropically in a dry etching process. As a result, third insulation structures 14 are produced. The third insulation structures 14 insulate from one another gate electrodes 13 which are arranged on opposite sides of one and the same second trench 10 (see FIG. 5). In the first trenches, the third insulation structures 14 cover the gate electrodes 13. The second trenches 10 are likewise essentially filled by the third insulation structures 14. Only a small unevenness remains, and this can be avoided by depositing the $SiO_2$ layer to a greater thickness.

A capacitor dielectric 15 is then applied. The capacitor dielectric 15 is produced from a material having high relative dielectric constant $\in_r$. The capacitor dielectric 15 is preferably formed from barium strontium titanate, strontium titanate or lead zirconate titanate. These ferroelectric and paraelectric layers are supplied, for example, by sputtering, in CVD processes or sol gel processes. The capacitor dielectric 15 is produced to a layer thickness of, for example, 50 nm.

In cases when there is a risk of the silicon of the third layer 4 being degraded by the material of the capacitor dielectric 15, it is within the scope of the present invention to provide an intermediate layer of, for example, TiN, Pt, W or $RuO_2$ between the third layer 4 and the capacitor dielectric 15.

For the case when the leakage currents in the capacitor dielectric are unacceptable for a memory application, the capacitor dielectric can be structured. However, an additional mask is required for this.

A capacitor plate 16 is applied on the capacitor dielectric over its full surface. For this purpose, a conductive layer, for example of TiN, Pt, W. RuO$_2$ or n$^+$-doped polysilicon, is deposited. The capacitor plate 16 is formed to a thickness of, for example, 100 nm.

In the DRAM cell arrangement, each storage cell comprises a read-out transistor which is formed by the vertical MOS transistor which is respectively bounded by neighboring first trenches and neighboring second trenches and comprises the part, arranged therein, of the first layer 2 as a source/drain region, of the second layer 3 as a channel region and of the third layer 4 as a source/drain region. The continuous part of the first layer (see FIG. 5) acts as a bit line. Perpendicularly to the bit line direction, neighboring gate electrodes 13, which are connected to one another in the region of the first trenches 8, form buried word lines. Neighboring word lines are insulated from one another by the third insulation structure. The storage cells furthermore comprise a storage capacitor which is formed by the respective part of the third layer 4 as the memory node, by the capacitor dielectric 15 and by the capacitor plate 17.

Only two masks are required for producing the DRAM cell arrangement. The first mask is for structuring the first SiO$_2$ layer 6, and the second mask is for etching the second trenches 10. If the structures in both masks are produced according to the minimum producible structure size F in the respective technology, then a space requirement of 4F$^2$ per storage cell results. On the basis of a technology with F=0.25 μm, a space requirement per storage cell of 0.25 μm$^2$ results. The two masks used are not critical with regard to their alignment. No further mask is required for structuring the gate electrodes and therefore the word line.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A process for producing a DRAM cell arrangement, comprising the steps of:
    producing storage cells each having a read-out transistor and a storage capacitor;
    producing bit lines buried in a semiconductor substrate;
    forming the read-out transistors as vertical MOS transistors in the semiconductor substrate, such that a first source/drain region of each vertical MOS transistor adjoins a main surface of the semiconductor substrate and a second source/drain region of each vertical MOS transistor adjoins one of the buried bit lines, and a gate oxide and gate electrode of each vertical MOS transistor annularly surround a channel region that is arranged between the first and second source/drain regions;
    arranging the vertical MOS transistors along a word line such that gate electrodes of neighboring vertical MOS transistors adjoin one another; and
    producing each storage capacitor with a memory node which is electrically connected to one of the first source/drain regions.

2. The process according to claim 1, wherein the semiconductor substrate has a first layer, which is doped with a first conductivity type, a second layer, which is doped with a second conductivity type that is opposite the first conductivity type, and a third layer which is doped with the first conductivity type and adjoins the main surface,
    the process further comprising the steps of:
        etching first trenches, which are each strip-shaped, extend substantially parallel and cut through the first layer, the second layer and the third layer;
        etching second trenches, which are each strip-shaped, extend essentially parallel, cross the first trenches and extend into the first layer without cutting through the first layer;
        providing the second trenches with a second insulation structure, a width of the second trenches being greater than a width of the first trenches;
        selectively etching the first insulation structures and the second insulation structures with respect to the semiconductor material, until surfaces of the structured second layer and third layer are exposed at sides of the first trenches and sides of the second trenches;
        forming a gate oxide which covers at least an exposed surface of the second layer;
        producing, in order to form the gate electrodes, a doped polysilicon layer with substantially conformal edge coverage a thickness of which is dimensioned such that it fills the first trenches, but does not fill the second trenches, and which is anisotropically etched back so that doped polysilicon spacers are produced at the sides of the second trenches and the surface of the second insulation structures is partially exposed in the second trenches, whereas the surface of the first insulation structure remains covered by doped polysilicon in the first trenches; and
        producing a third insulation structure which covers the gate electrodes.

3. The process according to claim 2, wherein a first trench mask is used for etching the first trenches;
    wherein, in order to form the first trench mask, a first SiO$_2$ layer is deposited and is structured using photolithographic processes; and
    wherein a second SiO$_2$ layer with substantially conformal edge coverage is deposited and is anisotropically etched back so that SiO$_2$ spacers, by which the width of the first trenches is defined, are produced at sides of the structured first SiO$_2$ layer.

4. The process according to claim 2, wherein the semiconductor substrate is formed of monocrystalline silicon at least in a region of the DRAM cell arrangement and wherein the first layer, the second layer and the third layer are epitaxially grown.

5. The process according to claim 4, wherein a conductive layer of epitaxially grown CoSi$_2$, which is cut through during etching of the first trenches, is produced under the first layer.

6. The process according to claim 1, wherein for forming the storage capacitors, a capacitor dielectric and a capacitor plate are applied above the first source/drain regions, so that the first source/drain regions simultaneously act as memory nodes.

7. The process according to claim 6, wherein the capacitor dielectric is formed by one of the materials barium strontium titanate, strontium titanate and lead zirconate titanate.

* * * * *